United States Patent
Chen et al.

(10) Patent No.: US 7,554,367 B2
(45) Date of Patent: Jun. 30, 2009

(54) DRIVING CIRCUIT

(75) Inventors: Cheng-Sung Chen, Dadu Township, Taichung County (TW); Wei-Hsuan Huang, Taoyuan (TW)

(73) Assignee: System General Corp., Taipei Hsien (TW)

( * ) Notice: Subject to any disclaimer, the term of this patent is extended or adjusted under 35 U.S.C. 154(b) by 401 days.

(21) Appl. No.: 11/603,073

(22) Filed: Nov. 22, 2006

(65) Prior Publication Data

US 2008/0116955 A1 May 22, 2008

(51) Int. Cl.
*H03B 1/00* (2006.01)
(52) U.S. Cl. ..................... 327/112; 327/108; 327/376; 327/377
(58) Field of Classification Search .............. 327/112, 327/376, 377
See application file for complete search history.

(56) References Cited

U.S. PATENT DOCUMENTS 5,796,276 A * 8/1998 Phillips et al. ............. 327/108
6,414,523 B1 * 7/2002 Yoshizaki .................. 327/112
7,282,946 B2 * 10/2007 Har et al. ................... 326/21

\* cited by examiner

*Primary Examiner*—Long Nguyen
(74) *Attorney, Agent, or Firm*—Rosenberg, Klein & Lee

(57) ABSTRACT

The present invention provides a driving circuit. It includes a plurality of current mirrors to generate a first charge current and a second charge current in response to a reference current. A switch circuit generates a driving signal in response to an input signal. A driving switch is coupled between the first charge current and the switch circuit. Once the driving switch is turned on and the level of the input signal is in high level, the switch circuit generates the driving signal, the level of the driving signal-being in high level, in response to the first charge current and the second charge current. A detection circuit generates a control signal to turn on/off the driving switch. The detection circuit turns off the driving switch to disable the first charge current after a period of delay time when the level of the driving signal is in high level.

25 Claims, 5 Drawing Sheets

DRIVING CIRCUIT

BACKGROUND OF THE INVENTION

1. Field of the Invention

The present invention relates to a controller. More particularly, the present invention relates to a driving circuit for the controller.

2. Description of Related Art

With the progress of modern science, the functionality of the electronic devices becomes better and better for people it is more the convenience in the living. Nowadays, greater part of the electronic devices include a controller to generate a driving signal for control other circuits of the electronic devices, such as power supply, power converter and regulator, etc.

FIG. 1 shows a circuit diagram of a traditional power supply. As shown in the figure, the traditional power supply comprises a transformer 10 having a primary winding $N_P$, a secondary winding $N_S$ and an auxiliary winding $N_A$. A terminal of the primary winding $N_P$ is coupled to receive an input voltage $V_{IN}$. A transistor 12 is coupled from another terminal of the primary winding $N_P$ to a terminal of a current sense resistor 14. Another terminal of the current sense resistor 14 is coupled to the ground. The current sense resistor 14 is used to convert a switching current $I_P$ of the transformer 10 to a sense voltage $V_I$. A start resistor 16 is connected from the input voltage $V_{IN}$ to charge a supplied capacitor 18. The supplied capacitor 18 further is connected to an input terminal VDD of a control circuit 35 of a controller 30 for supplying the power to the control circuit 35. Once the voltage $V_{DD}$ is charged up to a start up voltage of the control circuit 35, the control circuit 35 will start to operate.

A ground terminal GND of the control circuit 35 is coupled to the ground. A current sense terminal VS of the control circuit 35 receives the sense voltage $V_I$ which represents the switching current $I_P$ of the transformer 10. A feedback terminal FB of the control circuit 35 is coupled to receive an output voltage $V_O$ at an output terminal of the power supply through an optical-coupler 20 to generate a feedback signal $V_{FB}$ in response to the output voltage $V_O$. In accordance with the feedback signal $V_{FB}$ and the sense voltage $V_I$, a switching signal $V_G$ is generated by an output terminal VG of the control circuit 35 and then transmitted to a driving circuit 38 of the controller 30. In accordance with the switching signal VG, the driving circuit 38 generates a driving signal $V_D$ to turn on/off the transistor 12 for switching the transformer 10 and regulating the output voltage $V_O$ of the power supply. After the switching of the transformer 10, the power of the control circuit 35 further is supplied from the auxiliary winding $N_A$ of the transformer 10 via a diode 19. If a fault condition is occurred, the switching of the transformer 10 will be stop and the supplied capacitor 18 will be discharged.

A resistor 22 is coupled to a zener diode 24. The zener diode 24 further is coupled to the optical-coupler 20. The optical-coupler 20 further is coupled to the output terminal of the power supply to generate the feedback signal $V_{FB}$ at the feedback terminal FB. A rectifier 26 is coupled between a terminal of the secondary winding $N_S$ and the output terminal of the power supply. A filter capacitor 28 is coupled to the rectifier 26 and another terminal of the secondary winding $N_S$.

FIG. 2 shows a circuit diagram of a traditional driving circuit 38 shown in FIG. 1. As shown in the figure, the traditional driving circuit 38 comprises a V-to-I converter 380 for generating a reference current $I_R$ in response to a reference voltage $V_R$. The V-to-I converter 380 includes an operational amplifier 381, a resistor 382 and a transistor 383. The driving circuit 38 further comprises a plurality of current mirrors including transistors 384, 385, 386 for generating a charge current $I_{385}$ and a discharge current $I_{386}$ in response to the reference current $I_R$. A switch circuit 387 includes switches 388, 389 for generating the driving signal $V_D$. The switches 388, 389 can be the transistors. The switch 388 is coupled to receive a supply voltage $V_{CC}$. The switch 389 is coupled to the ground. The input terminals of the inverter 390, 393 are coupled to the control circuit 35 to receive the switching signal $V_G$. The output terminals of the inverter 390, 393 are coupled to a control switch 395 and the switch 389 respectively. The inverter 390 further is coupled to the supply voltage $V_{CC}$ and the ground. The inverter 393 further is coupled to the transistor 386 and the ground. The control switch 395 is coupled to the switch 388 and the ground.

The switch 388 is turned on by the charge current $I_{385}$ according to the turn off of the control switch 395. The control switch 395 is turned off when the level of the switching signal $V_G$ is in high level. Meanwhile, the switch 389 is turned off. Once the switch 388 is turned on, the switch 388 outputs the driving signal $V_D$ that the level of the driving signal $V_D$ is in high level and the level of the driving signal $V_D$ is correlated with the level of the supply voltage $V_{CC}$. The level of the driving signal $V_D$ is in low level when the level of the switching signal $V_G$ is in low level. Once the level of the switching signal $V_G$ is in low level, the control switch 395 is turned on to turn off the switch 388. Meanwhile, the switch 389 is turned on. Thus, the switch 389 outputs the driving signal $V_D$ that the level of the driving signal $V_D$ is in low level and the level of the driving signal $V_D$ is correlated with the ground.

A zener diode 397 is coupled between the switch 388 and the ground. The zener diode 397 is used to clamp the level of the driving signal $V_D$ to a constant level for protecting the transistor 12 of the power supply when the switch 388 is turned on to generate the driving signal $V_D$ and the level of the supply voltage $V_{CC}$ is higher than the constant level. However, once the level of the supply voltage $V_{CC}$ is higher than the constant level, the zener diode 397 is turned on and forms a low impedance current path for the charge current $I_{385}$. Thus, the charge current $I_{385}$ will flows into the ground. However, the charge current $I_{385}$ is wasted. Therefore, reducing the charge current loss for power saving is requirement. The object of present invention is to provide a high efficiency driving circuit.

SUMMARY OF THE INVENTION

The present invention provides a driving circuit includes a current source for providing a reference current. A plurality of current mirrors are coupled to the current source to generate a first charge current and a second charge current in response to the reference current. A switch circuit generates a driving signal in response to an input signal. The level of the driving signal corresponds to the level of the input signal. A driving switch is coupled between the first charge current and the switch circuit. Once the driving switch is turned on and the level of the input signal is in high level, the switch circuit generates the driving signal that the level of the driving signal is in high level in response to the first charge current and the second current. A detection circuit is coupled to the switch circuit and the driving switch. The detection circuit generates a control signal to turn on/off the driving switch. The detection circuit turns off the driving switch to disable the first charge current after a period of delay time when the level of the driving signal is in high level.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings.

DETAILED DESCRIPTION OF THE INVENTION

Figure 1:
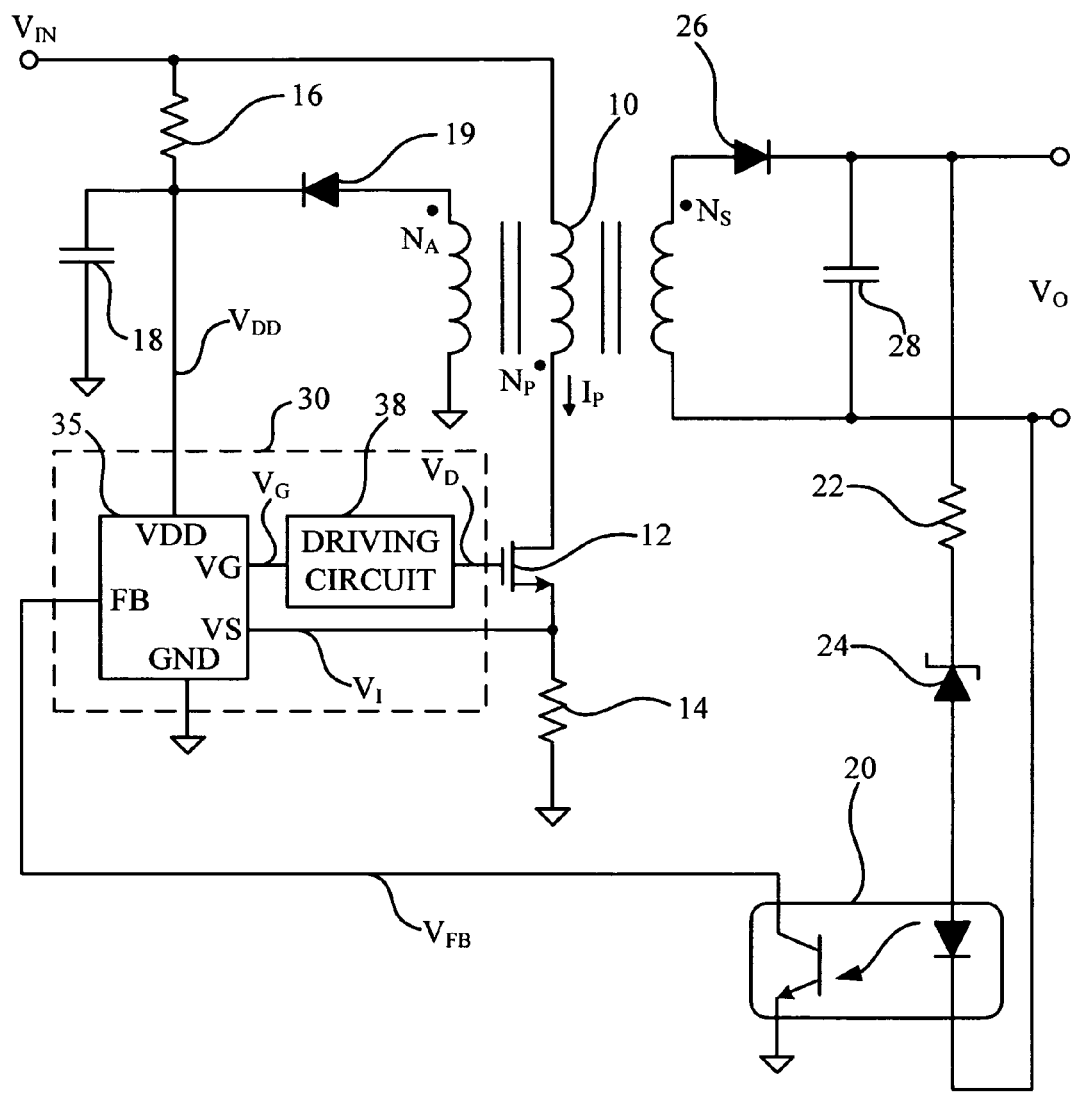
FIG. 1 shows a circuit diagram of a traditional power supply.
Figure 2:
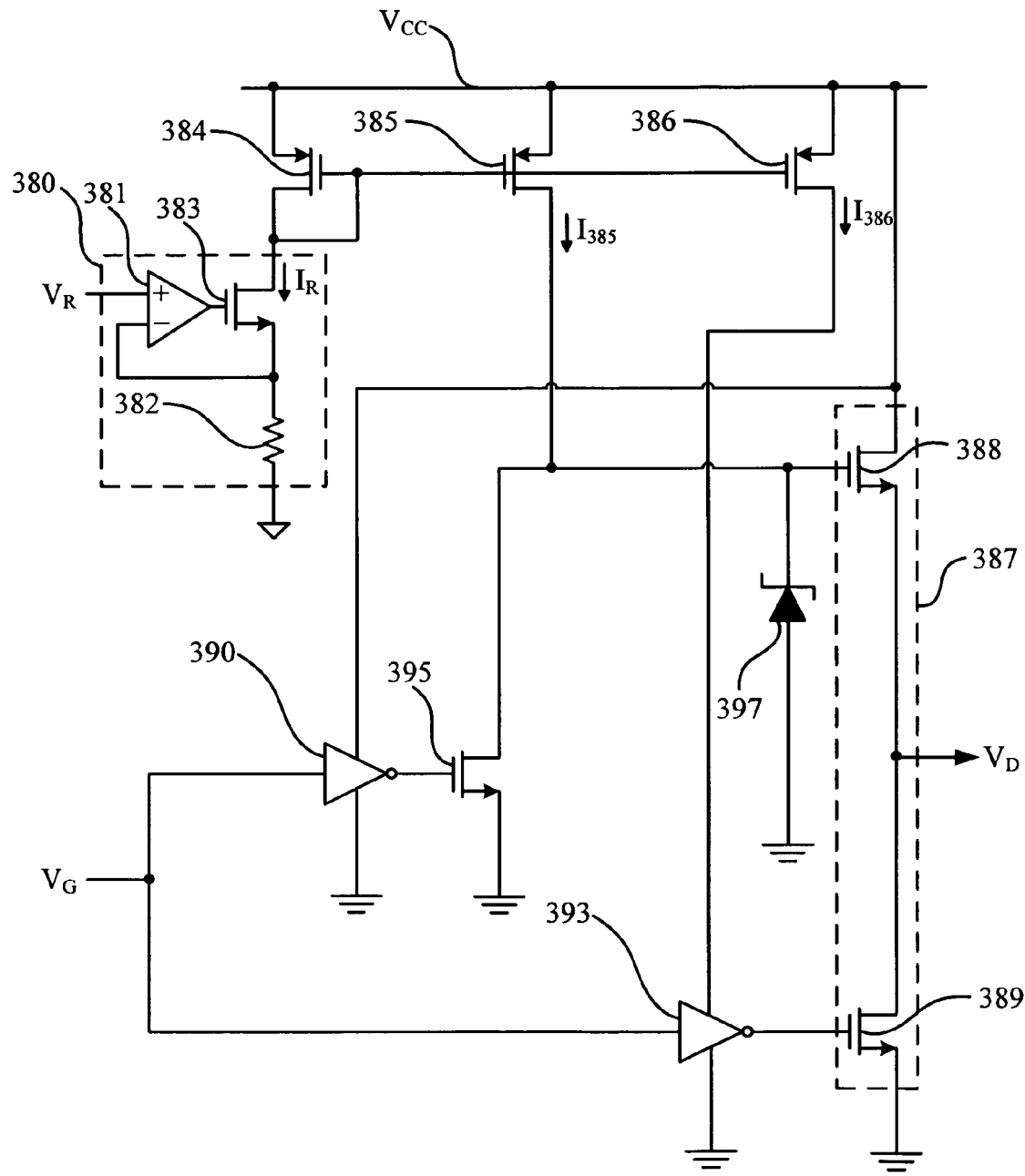
FIG. 2 shows a circuit diagram of a traditional driving circuit.
Figure 3:
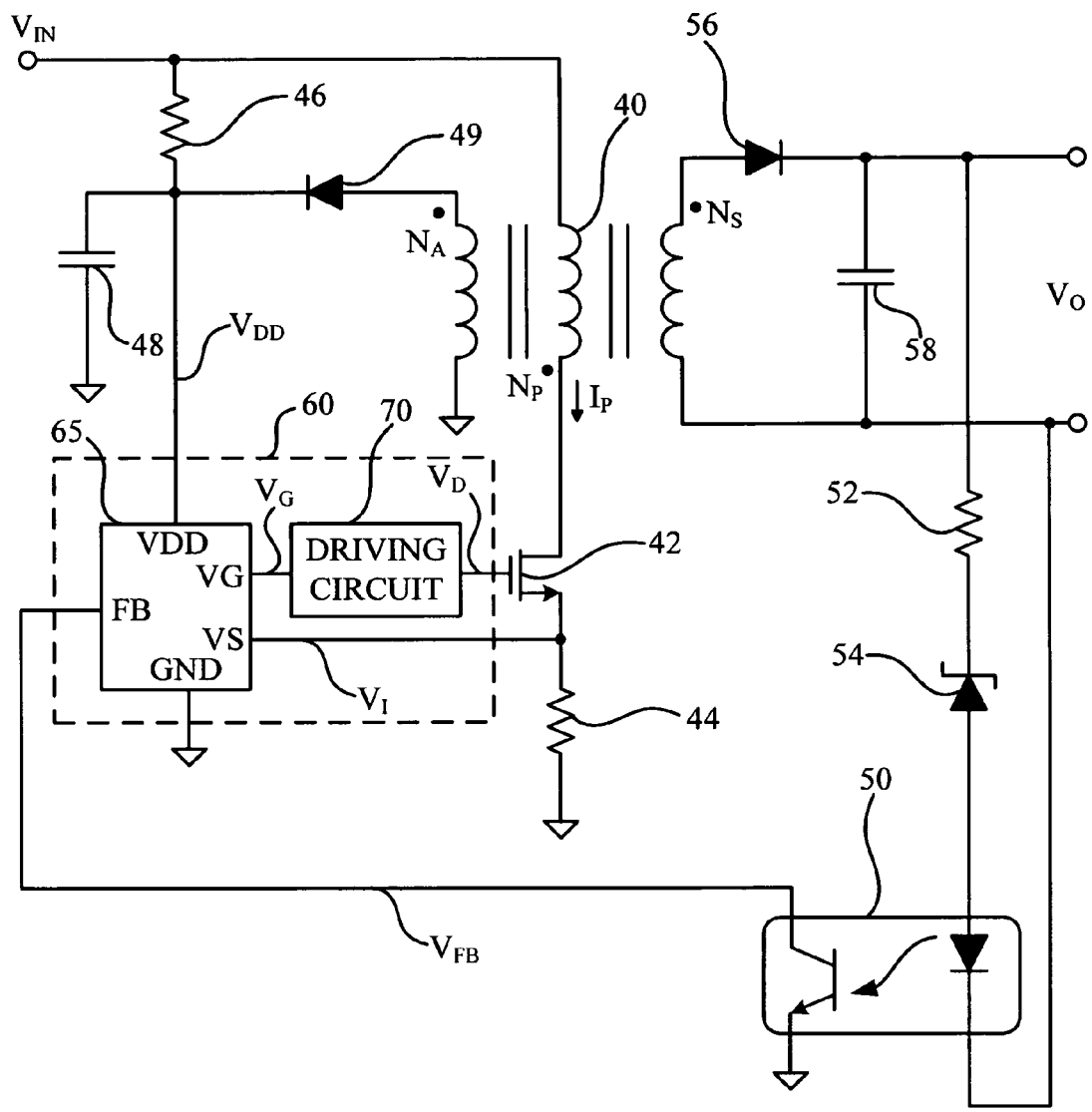
FIG. 3 shows a circuit diagram of a power supply according to the present invention.

FIG. 3 is a circuit diagram illustrating one embodiment of a power supply including a controller 60 having a driving circuit 70 in accordance the present invention. The power supply comprises a transformer 40 switched by a transistor 42. The transistor 42 is controlled by the controller 60. The transformer 40 includes a primary winding $N_P$, a secondary winding $N_S$ and an auxiliary winding $N_A$. The primary winding $N_P$ is coupled to the transistor 42 and receives an input voltage $V_{IN}$. The transistor 42 further is coupled to a current sense resistor 44 coupled to the ground. The current sense resistor 44 is used to convert a switching current $I_P$ of the transformer 40 to a sense voltage $V_I$ which represents the switching current $I_P$ of the transformer 10. A start resistor 46 is coupled between the input voltage $V_{IN}$ and a supplied capacitor 48 to charge the supplied capacitor 48. The supplied capacitor 48 is coupled to an input terminal VDD of a control circuit 65 of the controller 60 for supplying the power to the control circuit 65. The control circuit 65 will start to operate when the voltage $V_{DD}$ is charged up to a start up voltage of the control circuit 65.

Furthermore, the control circuit 65 has a ground terminal GND, current sense terminal VS, a feedback terminal FB and an output terminal VG The ground terminal GND is coupled to the ground. The current sense terminal VS is coupled to the current sense resistor 44 to receive the sense voltage $V_I$. The feedback terminal FB is coupled to a feedback circuit that is coupled to the output terminal of the power supply and includes an optical-coupler 50 a resistor 52 and a zener diode 54 to generate a feedback signal $V_{FB}$ in response to the output voltage $V_O$ of the power supply. The control circuit 65 generates a switching signal $V_G$ at the output terminal VG in response to the feedback signal $V_{FB}$ and the sense voltage $V_I$. The switching signal $V_G$ is transmitted to a driving circuit 70 of the controller 60 for generating a driving signal $V_D$ in response to the switching signal $V_G$. The driving signal $V_D$ is utilized to turn on/off the transistor 42 for switching the transformer 40 and regulating the output voltage $V_O$ of the power supply. After switching the transformer 40, the power of the control circuit 65 further is supplied from the auxiliary winding $N_A$ of the transformer 40 via a diode 49. Once a fault condition is occurred, the controller 60 will stop switching the transformer 40 and the supplied capacitor 48 will be discharged.

Moreover, a terminal of the secondary winding $N_S$ of the transformer 40 is coupled to a rectifier 56. The rectifier 56 further is coupled to the output terminal of the power supply and a filter capacitor 58. The filter capacitor 58 further is coupled to another terminal of the secondary winding $N_S$.

Figure 4:
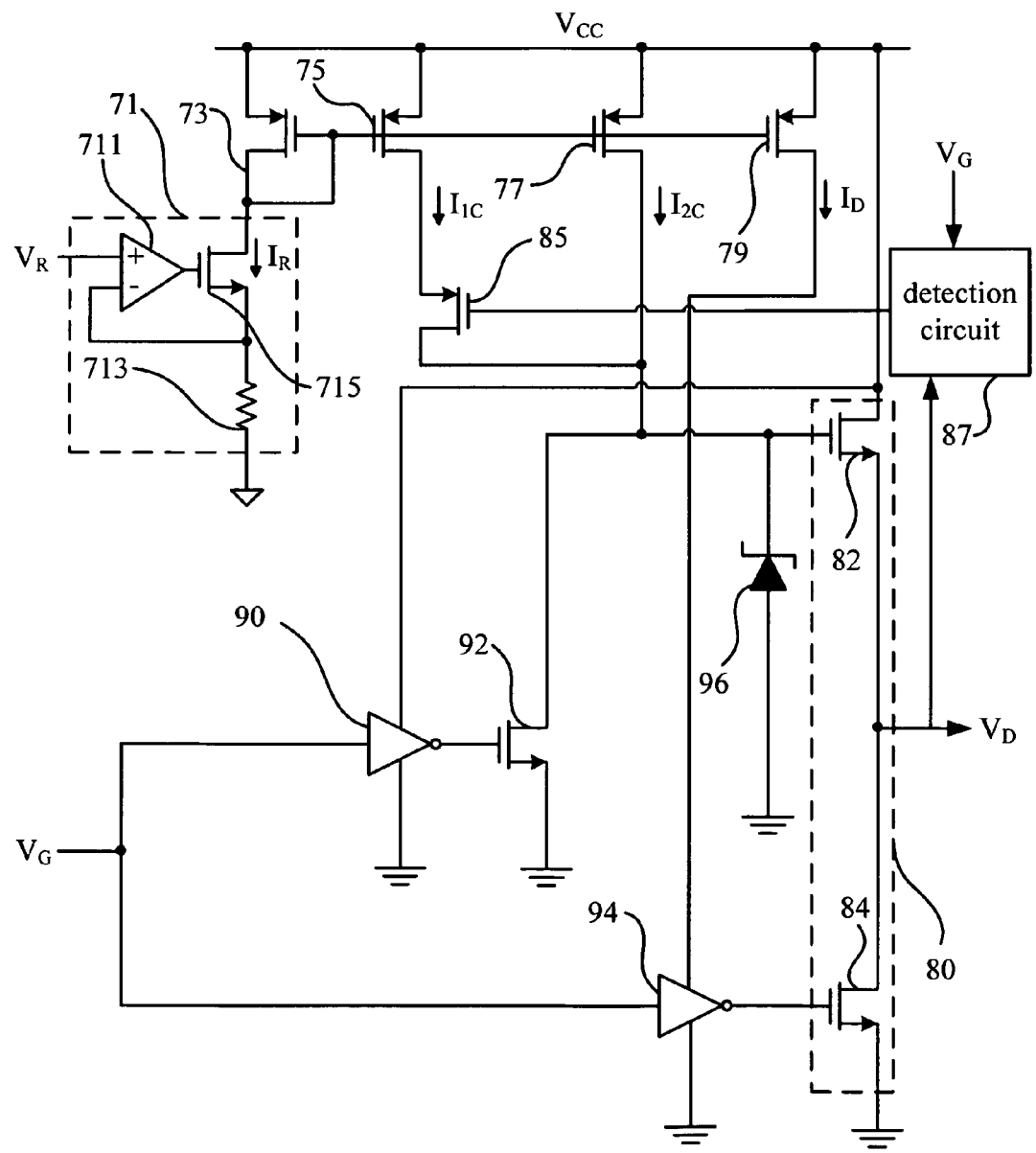
FIG. 4 shows a circuit diagram of a driving circuit according to the present invention.

FIG. 4 is a circuit diagram illustrating one embodiment of the driving circuit 70 shown in FIG. 3 in accordance the present invention. As shown in the figure, the driving circuit 70 of the present invention comprises a current source to provide a reference current $I_R$. The current source can be implemented by a V-to-I converter 71. The V-to-I converter 71 includes an operational amplifier 711, a resistor 713 and a transistor 715. The V-to-I converter 71 generates the reference current $I_R$ in response to a reference voltage $V_R$. A positive input terminal of the operational amplifier 711 is supplied with the reference voltage $V_R$. A negative input terminal of the operational amplifier 711 is connected to the source of the transistor 715. An output terminal of the operational amplifier 711 is coupled to the gate of the transistor 715. The drain of the transistor 715 is coupled to generate the reference current $I_R$. The resistor 713 is coupled between the source of the transistor 715 and the ground.

The driving circuit 70 further comprises a plurality of current mirrors. The current mirrors include a first current mirror, a second current mirror and a third current mirror. The first current mirror includes transistors 73, 75 for generating a first charge current $I_{1C}$ in response to the reference current $I_R$. The sources of the transistors 73, 75 are coupled to the supply voltage $V_{CC}$. The gates of the transistors 73, 75 and the drain of the transistor 73 are coupled together. The drain of the transistor 73 is coupled to the drain of the transistor 715 of the V-to-I converter 71. The drain of the transistor 75 generates the first charge current $I_{1C}$. The second current mirror includes transistors 73, 77 for generating a second charge current $I_{2C}$ in response to the reference current $I_R$. The source of the transistor 77 is coupled to the supply voltage $V_{CC}$. The gate of the transistor 77 is coupled to the gate of the transistor 73. The drain of the transistor 77 generates the second charge current $I_{2C}$. The second charge current $I_{2C}$ is lower than the first charge current $I_{1C}$. The third current mirror includes transistors 73, 79 for generating a discharge current $I_D$ in response to the reference current $I_R$. The source of the transistor 79 is coupled to the supply voltage $V_{CC}$. The gates of the transistors 73, 79 are coupled together. The drain of the transistor 79 generates the discharge current $I_D$.

A switch circuit 80 includes a first switch 82 and a second switch 84 to generate the driving signal $V_D$ in response to an input signal, such as the switching signal $V_G$ of the power supply. In the embodiment, the input signal is the switching signal $V_G$ and the driving signal $V_D$ is used to turn on/off the transistor 42 of the power supply. The first switch 82 and the second switch 84 can be implemented by the transistors. The level of the driving signal $V_D$ corresponds to the level of the switching signal $V_G$. It is to say, the driving signal $V_D$ is in the enabled/disabled state corresponds to the sate of the switching signal $V_G$. The drain of the first switch 82 is coupled to the supply voltage $V_{CC}$. The gate of the first switch 82 is coupled to the drain of the transistor 77 of the second current mirror and the drain of a driving switch 85. The driving switch 85 can be implemented by the transistor. The source of the first switch 82 outputs the driving signal $V_D$, the level of the driving signal $V_D$ being in high level and being correlated with the level of the supply voltage $V_{CC}$, when the first switch 82 is turned on by the first charge current $I_{1C}$ and the second charge current $I_{2C}$. It is to say, the switch circuit 80 is controlled by the first charge current $I_{1C}$ and the second charge current $I_{2C}$ to generate a driving signal in the enabled state.

The first charge current $I_{1C}$ driving the first switch 82 through the driving switch 85. The source of the driving switch 85 is coupled to the drain of the transistor 75 of the first current mirror. The gate of the driving switch 85 is coupled to a detection circuit 87. The detection circuit 87 is used to generate a control signal to turn on/off the driving switch 85. Once the driving switch 85 is turned on, the drain of the driving switch 85 transmits the first charge current $I_{1C}$. The detection circuit 87 generates the control signal to turn off the driving switch 85 to disable the first charge current $I_{1C}$ after a period of delay time for power saving when the first switch 82 generates the driving signal $V_D$. The source of the second switch 84 is coupled to the ground. The drain of the second switch 84 outputs the driving signal $V_D$, the level of the driving signal $V_D$ being in low level and being correlated with the level of the ground, when the second switch 84 is turned on by the switching signal $V_G$.

An input terminal of a first inverter 90 receives the switching signal $V_G$. An output terminal of the first inverter 90 is coupled to the gate of a control switch 92. The first inverter 90 further is coupled to the supply voltage $V_{CC}$ and the ground. The control switch 92 can be implemented by the transistor. The source of the control switch 92 is coupled to the ground. The drain of the control switch 92 is coupled to the drains of the driving switch 85 and the transistor 77. An input terminal of a second inverter 94 receives the switching signal $V_G$. An output terminal of the second inverter 94 is coupled to the gate of the second switch 84. The second inverter 94 further is coupled to the drain of the transistor 79 of the third current mirror and the ground. A zener diode 96 is coupled between the gate of the first switch 82 and the ground. The zener diode 96 is used to clamp the level of the driving signal $V_D$ to a constant level when the first switch 82 is turned on to generate the driving signal $V_D$ and the level of the supply voltage $V_{CC}$ is higher than the constant level. The constant level is the break-down level of the zener diode 96.

Once the level of the switching signal $V_G$ is in high level, the control switch 92 and the second switch 84 are turned off. Because the control switch 92 is turned off and the driving switch 85 is turned on, the first switch 82 is turned on in response to the first charge current $I_{1C}$ and the second charge current $I_{2C}$. Meanwhile, the first switch 82 generates the driving signal $V_D$, the level of the driving signal $V_D$ being in high level, to turn on the transistor 42 of the power supply. The detection circuit 87 generates the control signal to turn off the driving switch 85 to block the first charge current $I_{1C}$ for power saving after delaying a period when the level of the driving signal $V_D$ is in high level. When the driving switch 85 is switched off, the current flowed to the gate of the first switch 82 is the second charge current $I_{2C}$. Because the first switch 82 is already switched on for the period of time, the remaining second charge current $I_{2C}$ can still hold the first switch 82 being in the enabled state.

Once the level of the switching signal $V_G$ is in low level, the control switch 92 is turned on. Because the control switch 92 is turned on, the first charge current $I_{1C}$ and the second charge current $I_{2C}$ flows to the ground. Thus, the first switch 82 is turned off. Meanwhile, the second switch 84 is turned on to generate the driving signal $V_D$, the level of the driving signal $V_D$ being in low level, to turn off the transistor 42 of the power supply.

Figure 5:
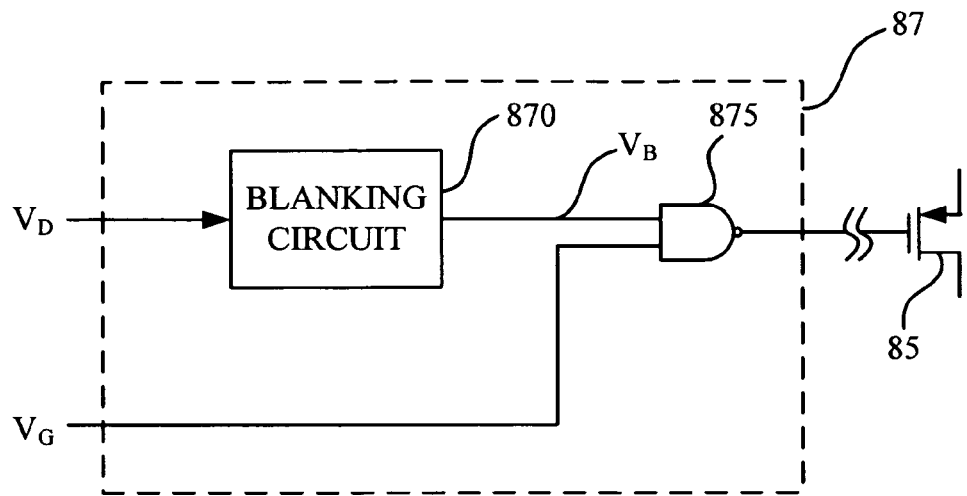
FIG. 5 shows a circuit diagram of a detection circuit of the driving circuit according to the present invention.

FIG. 5 is a circuit diagram illustrating one embodiment of the detection circuit 87 shown in FIG. 4 in accordance the present invention. As shown in the figure, the detection circuit 87 includes a blanking circuit 870 and a first NAND gate 875. The blanking circuit 870 is coupled to receive the driving signal $V_D$ for generating a blanking signal $V_B$ after the period of delay time. The input terminals of the first NAND gate 875 are coupled to receive the blanking signal $V_B$ and the switching signal $V_G$ for generating the control signal to turn on/off the driving switch 85. The transistor 85 is turned off by the control signal when the levels of the driving signal $V_D$ and the switching signal $V_G$ are in the high level.

Figure 6:
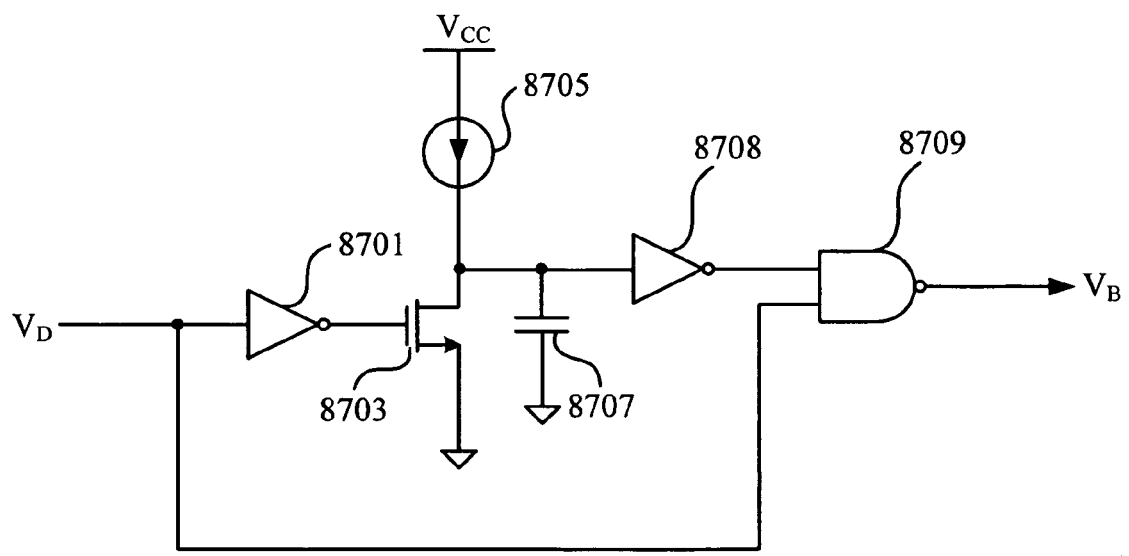
FIG. 6 shows a circuit diagram of a blanking circuit of the detection circuit according to the present invention.

FIG. 6 is a circuit diagram illustrating one embodiment of the blanking circuit 870 shown in FIG. 5 in accordance the present invention. As shown in the figure, the blanking circuit 870 includes a first inverter 8701, a transistor 8703, a constant current source 8705, a capacitor 8707, a second inverter 8708 and a second NAND gate 8709. An input terminal of the first inverter 8701 is coupled to receive the driving signal $V_D$. An output terminal of the first inverter 8701 is coupled to the gate of the transistor 8703 to turn on/off the transistor 8703. The constant current source 8705 is coupled from the supply voltage $V_{CC}$ to the drain of the transistor 8703. The source of the transistor 8703 is coupled to the ground. The constant current source 8705 further is coupled to the capacitor 8707 to charge the capacitor 8707. The capacitor 8707 further is coupled to an input terminal of the second inverter 8708. An output terminal of the second inverter 8708 is coupled to an input terminal of the second NAND gate 8709. Another input terminal of the second NAND gate 8709 is coupled to receive the driving signal $V_D$. The second NAND gate 8709 generates the blanking signal $V_B$ in response to the levels of the capacitor 8707 and the driving signal $V_D$. The constant current of the constant current source 8705 and the capacitance of the capacitor 8707 determine the period of the delay time.

When the level of the driving signal $V_D$ is in a high state, the transistor 8703 is turned off, and the constant current of the constant current source 8705 is flowed to charge the capacitor 8707. After the delay time determined by the constant current and the capacitance of the capacitor 8707, the blanking signal $V_B$ is generated and outputted to the first NAND gate 875 of the detection circuit 87 shown in FIG. 5.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A driving circuit, comprising:
   a current source, providing a reference current;
   a plurality of current mirrors, coupled to the current source to generate a first charge current and a second charge current in response to the reference current;
   a switch circuit, coupled to a supply voltage and a ground to generate a driving signal in response to an input signal, in which the level of the driving signal corresponds to the level of the input signal;
   a driving switch, coupled between the first charge current and the switch circuit, wherein the switch circuit generates the driving signal, the level of the driving signal being in high level, in response to the first charge current and the second current when the driving switch is turned on and the level of the input signal is in high level; and
   a detection circuit, coupled to the switch circuit and the driving switch, in which the detection circuit generates a control signal to turn on/off the driving switch, wherein the detection circuit turns off the driving switch to disable the first charge current after a period of time when the level of the driving signal is in high level.

2. The driving circuit as claimed in claim 1, wherein the current source is implemented by a V-to-I converter.

3. The driving circuit as claimed in claim 2, wherein the V-to-I converter comprises:
 an operational amplifier, coupled to receive a reference voltage;
 a resistor, coupled to the operational amplifier; and
 a transistor, coupled to the operational amplifier and the resistor to generate the reference current in response to the reference voltage.

4. The driving circuit as claimed in claim 1, wherein the current mirrors comprises:
 a first current mirror, coupled to the current source to generate the first charge current in response to the reference current; and
 a second current mirror, coupled to the current source to generate the second charge current in response to the reference current.

5. The driving circuit as claimed in claim 1, wherein the first charge current is higher than the second charge current.

6. The driving circuit as claimed in claim 1, wherein the switch circuit generates the driving signal, the level of the driving signal being in low level, when the level of the input signal is in low level.

7. The driving circuit as claimed in claim 1, wherein the switch circuit comprises:
 a first switch, coupled to the supply voltage, the driving switch and the second charge current, wherein the first switch generates the driving signal, the level of the driving signal being in high level, in response to the first charge current and the second charge current when the level of the input signal is in high level; and
 a second switch, coupled to the ground, wherein the second switch generates the driving signal, the level of the driving signal being in low level, when the level of the input signal is in low level.

8. The driving circuit as claimed in claim 7, further comprising:
 a first inverter, receiving the input signal;
 a second inverter, receiving the input signal and coupled to the second switch; and
 a control switch, coupled to the ground, the first inverter, the driving switch and the second charge current;
 wherein the control switch and the second switch are turned off and the first switch generates the driving signal, the level of the driving signal being in high level, when the level of the input signal is in high level, in which the control switch and the second switch are turned on and the second switch generates the driving signal, the level of the driving signal being in low level when the level of the input signal is in low level.

9. The driving circuit as claimed in claim 7, wherein the first switch further is coupled to a zener diode, in which the zener diode further is coupled to the ground.

10. The driving circuit as claimed in claim 1, wherein the detection circuit comprises:
 a blanking circuit, generating a blanking signal in response to the driving signal; and
 a first NAND gate, generating the control signal in response to the blanking signal and the input signal.

11. The driving circuit as claimed in claim 10, wherein the blanking circuit comprises:
 a constant current source, providing a constant current;
 a transistor, coupled to the constant current source;
 a capacitor, coupled to the transistor and the constant current source;
 a first inverter, coupled to the transistor to control the transistor in response to the driving signal, in which the capacitor is charged by the constant current of the constant current source when the transistor is turned off;
 a second inverter, coupled to the capacitor; and
 a second NAND gate, coupled to the second inverter to generate the blanking signal in response to the levels of the capacitor and the driving signal.

12. The driving circuit as claimed in claim 1, wherein the level of the driving signal is correlated with the level of the supply voltage when the level of the input signal is in high level.

13. The driving circuit as claimed in claim 1, wherein the level of the driving signal is correlated with the ground when the level of the input signal is in low level.

14. The driving circuit as claimed in claim 1, wherein the input signal is a switching signal.

15. The driving circuit as claimed in claim 1, wherein the driving signal is used to turn on/off a transistor of a power supply.

16. A driving circuit, comprising:
 a plurality of current mirrors, generating a first charge current and a second charge current in response to a reference current;
 a switch circuit, controlled by the first charge current and the second charge current, to generate a driving signal in an enabled state in response to an input signal; and
 a driving switch, coupled between the first charge current and the switch circuit, and controlled by a detection circuit to be in an enabled/disabled state;
 wherein the switch circuit is enabled by the first charge current plus the second charge current for generating the driving signal when the driving switch is enabled, after a delay time, the driving switch is disabled to block the first charge current and the switch circuit is still hold enabled by the second charge current for generating the driving signal.

17. The driving circuit as claimed in claim 16, wherein the current mirrors comprises:
 a first current mirror, generating the first charge current in response to the reference current; and
 a second current mirror, generating the second charge current in response to the reference current.

18. The driving circuit as claimed in claim 16, wherein the first charge current is higher than the second charge current.

19. The driving circuit as claimed in claim 16, wherein the switch circuit comprises:
 a first switch, coupled to a supply voltage, the driving switch and the second charge current, wherein the first switch generates the driving signal in the enabled state in response to the first charge current and the second charge current when the input signal is in the enabled state; and
 a second switch, coupled to the ground, wherein the second switch generates the driving signal in an disabled state when the input signal is in the disabled state.

20. The driving circuit as claimed in claim 19, further comprising:
 a first inverter, receiving the input signal;
 a second inverter, receiving the input signal and coupled to the second switch; and
 a control switch, coupled to the ground, the first inverter, the driving switch and the second charge current;
 wherein the control switch and the second switch are disabled and the first switch generates the driving signal in the enabled state when the input signal is in the enabled state, in which the control switch and the second switch are enabled and the second switch generates the driving signal in the disabled state when the input signal is in the disabled state.

21. The driving circuit as claimed in claim 19, wherein the first switch further is coupled to a zener diode, in which the zener diode further is coupled to the ground.

22. The driving circuit as claimed in claim 16, wherein the detection circuit comprises:

a blanking circuit, generating a blanking signal in response to the driving signal; and a first NAND gate, generating a control signal in response to the blanking signal and the input signal to control the driving switch to be in the enabled/disabled state.

23. The driving circuit as claimed in claim 22, wherein the blanking circuit comprises:

a constant current source, providing a constant current;

a transistor, coupled to the constant current source;

a capacitor, coupled to the transistor and the constant current source;

a first inverter, coupled to the transistor to control the transistor in response to the driving signal, in which the capacitor is charged by the constant current of the constant current source when the transistor is turned off;

a second inverter, coupled to the capacitor; and a second NAND gate, coupled to the second inverter to generate the blanking signal in response to the levels of the capacitor and the driving signal.

24. The driving circuit as claimed in claim 16, wherein the input signal is a switching signal.

25. The driving circuit as claimed in claim 16, wherein the driving signal is used to turn on/off a transistor of a power supply.

* * * * *